(12) United States Patent
Hu et al.

(10) Patent No.: US 11,917,851 B2
(45) Date of Patent: Feb. 27, 2024

(54) PACKAGING STRUCTURE, DISPLAY SUBSTRATE, DISPLAY APPARATUS AND METHOD FOR PACKAGING DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Youyuan Hu, Beijing (CN); Mengyu Luan, Beijing (CN); Xinfeng Wu, Beijing (CN); Bowen Liu, Beijing (CN); Xinzhu Wang, Beijing (CN); Fei Li, Beijing (CN); Huihui Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 637 days.

(21) Appl. No.: 17/256,187

(22) PCT Filed: Mar. 10, 2020

(86) PCT No.: PCT/CN2020/078607
§ 371 (c)(1),
(2) Date: Dec. 25, 2020

(87) PCT Pub. No.: WO2020/199862
PCT Pub. Date: Oct. 8, 2020

(65) Prior Publication Data
US 2021/0273201 A1  Sep. 2, 2021

(30) Foreign Application Priority Data
Mar. 29, 2019 (CN) .............. 201910250271

(51) Int. Cl.
*H10K 50/844* (2023.01)
*H10K 71/00* (2023.01)

(52) U.S. Cl.
CPC .......... *H10K 50/844* (2023.02); *H10K 71/00* (2023.02)

(58) Field of Classification Search
CPC ...... H10K 50/844; H10K 71/00; H10K 50/84; H10K 50/8445; H10K 59/87;
(Continued)

(56) References Cited

U.S. PATENT DOCUMENTS 10,932,982 B2 * 3/2021 Kabes ................. A63B 69/407
2014/0367659 A1 12/2014 Cho et al.
(Continued)

FOREIGN PATENT DOCUMENTS

| CN | 104538425 A | 4/2015 |
| CN | 104576959 A | 4/2015 |

(Continued)

OTHER PUBLICATIONS

International search report of PCT application No. PCT/CN2020/078607 dated Jun. 5, 2020.
(Continued)

*Primary Examiner* — Eduardo A Rodela
(74) *Attorney, Agent, or Firm* — Lippes Mathias LLP

(57) ABSTRACT

Provided is a packaging structure for packaging a display device, the packaging structure comprising: at least one composite film layer, wherein the composite film layer comprises an inorganic pattern and an organic pattern, the inorganic pattern comprises a plurality of curved structures arranged at intervals, the organic pattern comprises a first organic sub-pattern, and the first organic sub-pattern and the inorganic pattern are located in a same layer and are complementary in position; and wherein an orthographic projection (Continued)

of the composite film layer onto the display device at least covers a display area of the display device. A display substrate, a display apparatus, and a method for packaging a display device are also provided.

18 Claims, 6 Drawing Sheets

(58) Field of Classification Search
CPC .............. H10K 59/873; H10K 59/8731; H01L 51/5237; H01L 51/5256
See application file for complete search history.

(56) References Cited

U.S. PATENT DOCUMENTS

| | | |
|---|---|---|
| 2015/0102326 A1 | 4/2015 | An |
| 2017/0040392 A1 | 2/2017 | Wang et al. |
| 2017/0179434 A1* | 6/2017 | Chang .................. B32B 27/308 |
| 2019/0140210 A1* | 5/2019 | Cheng ................. H10K 50/844 |

FOREIGN PATENT DOCUMENTS

| | | |
|---|---|---|
| CN | 104733507 A | 6/2015 |
| CN | 106876612 A | 6/2017 |
| CN | 107689425 A | 2/2018 |
| CN | 109449305 A | 3/2019 |
| CN | 109873090 A | 6/2019 |
| EP | 3553825 A1 | 10/2019 |
| KR | 20120075705 A | 7/2012 |

OTHER PUBLICATIONS

First office action of Chinese application No. 201910250271.5 dated Sep. 24, 2020.

* cited by examiner

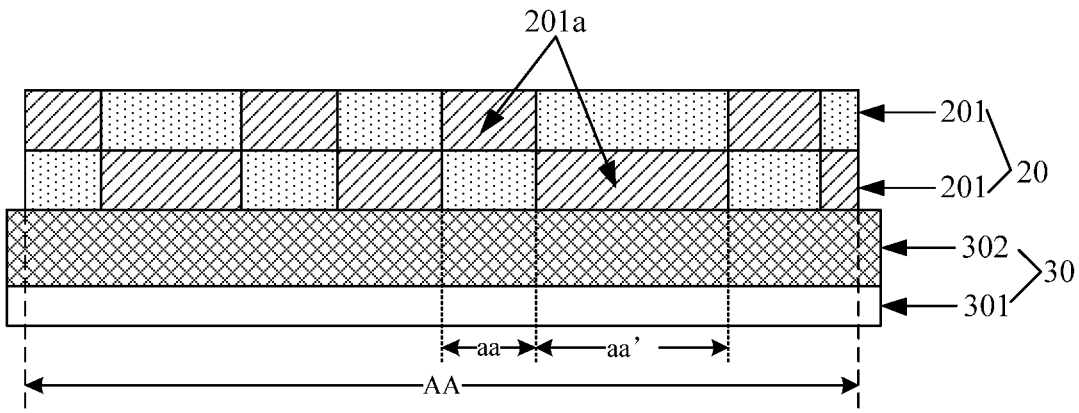

FIG. 12

| Providing a display device, wherein the display device includes a base substrate and a light-emitting device located on the base substrate | 401 |

| Forming at least one composite film layer on a side of the light-emitting device distal from the base substrate, wherein the composite film layer includes an inorganic pattern and an organic pattern, the inorganic pattern includes a plurality of curved structures arranged at intervals, the organic pattern includes a first organic sub-pattern, and the first organic sub-pattern and the inorganic pattern are located in a same layer and are complementary in position | 402 |

FIG. 13

PACKAGING STRUCTURE, DISPLAY SUBSTRATE, DISPLAY APPARATUS AND METHOD FOR PACKAGING DISPLAY DEVICE

CROSS-REFERENCE TO RELATED APPLICATIONS

The present disclosure is a 371 of PCT/CN2020/078607 filed on Mar. 10, 2020, which claims priority to Chinese Patent Application No. 201910250271.5, filed on Mar. 29, 2019 and entitled "PACKAGING STRUCTURE, DISPLAY SUBSTRATE, DISPLAY APPARATUS AND METHOD FOR PACKAGING DISPLAY DEVICE", which is incorporated herein by reference in its entirety.

TECHNICAL FIELD

The present disclosure relates to the field of display technologies, and particularly, relates to a packaging structure, a display substrate, a display apparatus, and a method for packaging a display device.

BACKGROUND

As the contact of the organic light-emitting material in an organic light-emitting diode (OLED) device with moisture and oxygen would affect the light-emitting effect of the organic light-emitting material, and in turn affect the quality and service life of the OLED device, the packaging of the OLED device is very important. At present, the OLED device is usually packaged with a multilayered thin-film packaging layer as the packaging structure. The multilayered thin-film packaging layer includes an inorganic packaging layer and an organic packaging layer which are disposed in layers along a direction away from the OLED device. The inorganic packaging layer is configured to isolate moisture and oxygen, and the organic packaging layer is configured to buffer an external force.

SUMMARY

The present disclosure provides a packaging structure, a display substrate, a display apparatus, and a method for packaging a display device. The technical solution is as follows:

In one aspect, a packaging structure for packaging a display device is provided, and the packaging structure includes:
  at least one composite film layer, wherein the composite film layer includes an inorganic pattern and an organic pattern, the inorganic pattern includes a plurality of curved structures arranged at intervals, the organic pattern includes a first organic sub-pattern, and the first organic sub-pattern and the inorganic pattern are located in a same layer and are complementary in position;
  wherein an orthographic projection of the composite film layer onto the display device at least covers a display area of the display device.

Optionally, the packaging structure includes a plurality of composite film layers, wherein the plurality of composite film layers are arranged in layers along a direction away from the display device; and
  a union set of orthographic projection areas of the inorganic patterns in the plurality of composite film layers onto the display device covers the display area.

Optionally, the plurality of composite film layers includes a first composite film layer and a second composite film layer, and an orthographic projection area of an inorganic pattern in the first composite film layer onto the display device and an orthographic projection area of an inorganic pattern in the second composite film layer onto the display device are complementary in position.

Optionally, the plurality of composite film layers includes a first composite film layer and a second composite film layer, a union set of an orthographic projection of an inorganic pattern in the first composite film layer onto the display device and an orthographic projection of an inorganic pattern in the second composite film layer onto the display device covers the display area, and an overlapping area exists between the orthographic projection of the inorganic pattern in the first composite film layer onto the display device and the orthographic projection of the inorganic pattern in the second composite film layer onto the display device.

Optionally, the plurality of curved structures are disposed at equal intervals.

Optionally, a width of the curved structure is equal to a distance between two adjacent curved structures.

Optionally, the plurality of curved structures includes at least one of a polyline-shaped structure and an arc-shaped structure.

Optionally, the polyline-shaped structure includes at least one of a zigzag structure, a W-shaped structure, a Z-shaped structure and a V-shaped structure, and the arc-shaped structure includes at least one of a wave-shaped structure, an S-shaped structure and a U-shaped structure.

Optionally, the organic pattern further includes a second organic sub-pattern, and the second organic sub-pattern is located on a side of the first organic sub-pattern and the inorganic pattern distal from the display device.

Optionally, an orthographic projection of the second organic sub-pattern onto the display device covers the display area.

Optionally, the plurality of curved structures are disposed at equal intervals, and a width of the curved structure is equal to a distance between two adjacent curved structures; and
  the organic pattern further includes a second organic sub-pattern located on a side of the first organic sub-pattern and the inorganic pattern distal from the display device, and an orthographic projection of the second organic sub-pattern onto the display device covers the display area.

In another aspect, a display substrate is provided, including: a display device and the packaging structure according to any of the first aspect; wherein
  the display device includes a base substrate and a light-emitting device on the base substrate, the packaging structure is located on a side of the light-emitting device distal from the base substrate, and an orthographic projection of the packaging structure onto the display device at least covers a display area of the display device.

Optionally, the display device is a flexible display device.
Optionally, the display device is an organic light-emitting diode display device or a quantum dot light-emitting diode display device.

In yet another aspect, a display apparatus is provided, including: the display substrate according to any of the another aspect.

In still a further aspect, a method for packaging a display device is provided, and the method includes:

providing a display device, wherein the display device includes a base substrate and a light-emitting device on the base substrate;

forming at least one composite film layer on a side of the light-emitting device distal from the base substrate, wherein the composite film layer includes an inorganic pattern and an organic pattern, the inorganic pattern includes a plurality of curved structures arranged at intervals, the organic pattern includes a first organic sub-pattern, and the first organic sub-pattern and the inorganic pattern are located in a same layer and are complementary in position;

wherein an orthographic projection of the composite film layer onto the display device at least covers a display area of the display device.

Optionally, forming at least one composite film layer on the side of the light-emitting device distal from the base substrate includes:

forming an inorganic pattern on the side of the light-emitting device distal from the base substrate; and forming an organic pattern on the light-emitting device on which the inorganic pattern has been formed to obtain one composite film layer.

Optionally, forming the inorganic pattern on the side of the light-emitting device distal from the base substrate includes:

forming the inorganic pattern on the side of the light-emitting device distal from the base substrate by using a first mask plate, and forming the organic pattern on the light-emitting device on which the inorganic pattern has been formed includes:

forming the first organic sub-pattern on the light-emitting device on which the inorganic pattern has been formed by using a second mask plate, a hollow area of the first mask plate and a hollow area of the second mask plate are complementary in shape.

Optionally, forming the inorganic pattern on the side of the light-emitting device distal from the base substrate includes:

forming the inorganic pattern on the side of the light-emitting device distal from the base substrate by using a first mask plate, and forming the organic pattern on the light-emitting device on which the inorganic pattern has been formed includes:

forming the organic pattern on the light-emitting device on which the inorganic pattern has been formed by a coating process, wherein the organic pattern includes the first organic sub-pattern and a second organic sub-pattern which is arranged as an entire layer, and the second organic sub-pattern is located on a side of the first organic sub-pattern and the inorganic pattern distal from the light-emitting device.

Optionally, forming at least one composite film layer on the side of the light-emitting device distal from the base substrate includes:

sequentially forming a plurality of composite film layers on the side of the light-emitting device distal from the base substrate.

BRIEF DESCRIPTION OF DRAWINGS

FIG. 12 is a schematic structural diagram of a display substrate according to an embodiment of the present disclosure; and FIG. 13 is a flowchart diagram of a method for packaging a display device according to an embodiment of the present disclosure.

DESCRIPTION OF EMBODIMENTS

In order to make the objectives, technical solutions and advantages of the present disclosure clearer, the followings will describe the embodiments of the present disclosure in detail with reference to the drawings.

The OLED device, as a flexible display device, can be used to prepare a flexible display apparatus (for example, a curved screen). As the flexible display apparatus per se needs to bear a large amount of bending, and the rigidity of the inorganic packaging layer in the traditional packaging structure is relatively large and is prone to fracture during bending, the packaging reliability of the OLED device may be affected.

Figure 1:
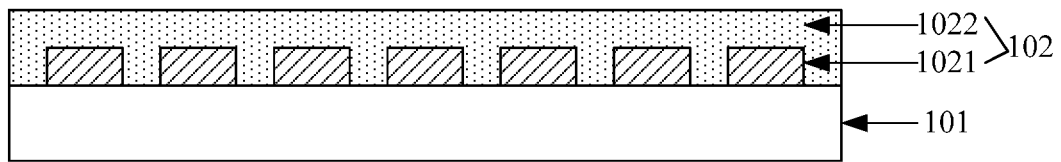
FIG. 1 is a schematic structural diagram of a flexible display apparatus provided in the related art.
Figure 2:
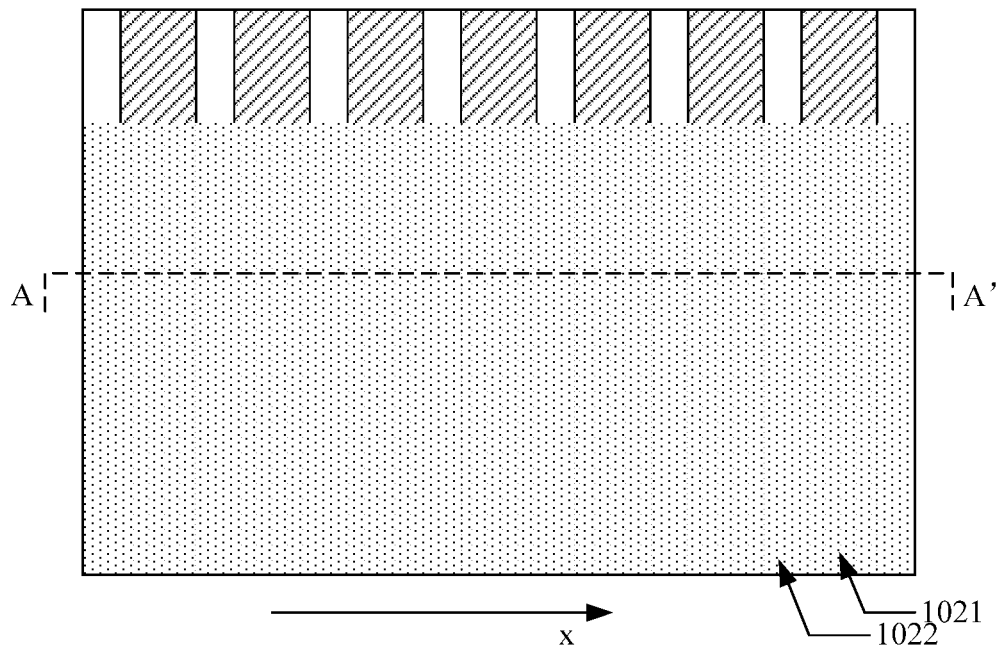
FIG. 2 is a schematic top view of the flexible display apparatus shown in FIG. 1.

FIG. 1 is a schematic structural diagram of a flexible display apparatus provided in the related art. As shown in FIG. 1, the flexible display apparatus includes a display device 101 and a packaging structure 102 for packaging the display device 101. The packaging structure 102 includes an inorganic pattern 1021 and an organic pattern 1022. FIG. 2 is a schematic top view of the flexible display apparatus shown in FIG. 1. FIG. 1 is a schematic cross-sectional view of the flexible display apparatus shown in FIG. 2 along the AA' direction. As shown in FIG. 2, the inorganic pattern 1021 includes a plurality of strip structures arranged at intervals, and the organic pattern 1022 is disposed between two adjacent strip structures. When the flexible display apparatus is bent in an arrangement direction x of the plurality of strip structures, a bending stress applied on the strip structures can be released to the organic material in contact with the strip structures, thereby avoiding a damage to the strip structures which may affect the packaging effect.

However, due to the restriction from the inorganic pattern in the packaging structure, the flexible display apparatus can only be bent in a specified direction (i.e., the arrangement direction x of the plurality of strip structures), resulting in a high limitation on the bending.

Figure 3:
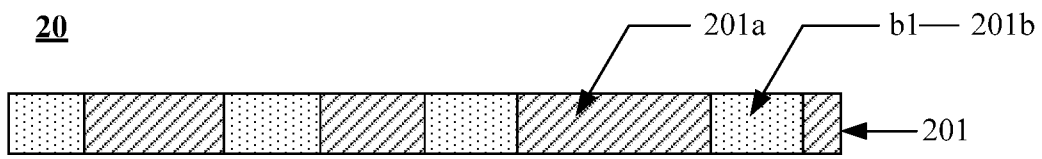
FIG. 3 is a schematic structural diagram of a packaging structure according to an embodiment of the present disclosure.

FIG. 3 is a schematic structural diagram of a packaging structure according to an embodiment of the present disclosure. The packaging structure is configured to package a display device. As shown in FIG. 3, the packaging structure 20 includes:

at least one composite film layer 201, wherein the composite film layer 201 includes an inorganic pattern 201a and an organic pattern 201b. An orthographic projection of the composite film layer 201 onto the display device at least covers a display area of the display device. Optionally, the orthographic projection of the composite film layer onto the display device overlaps the display area of the display device. Alternatively, the orthographic projection of the composite film layer onto the display device covers the display area of the display device, and an edge of the composite film layer is located on a non-display area of the display device, that is, the orthographic projection of the composite film layer onto the display device covers the display area and part or all of the non-display area of the display device.

Figure 4:
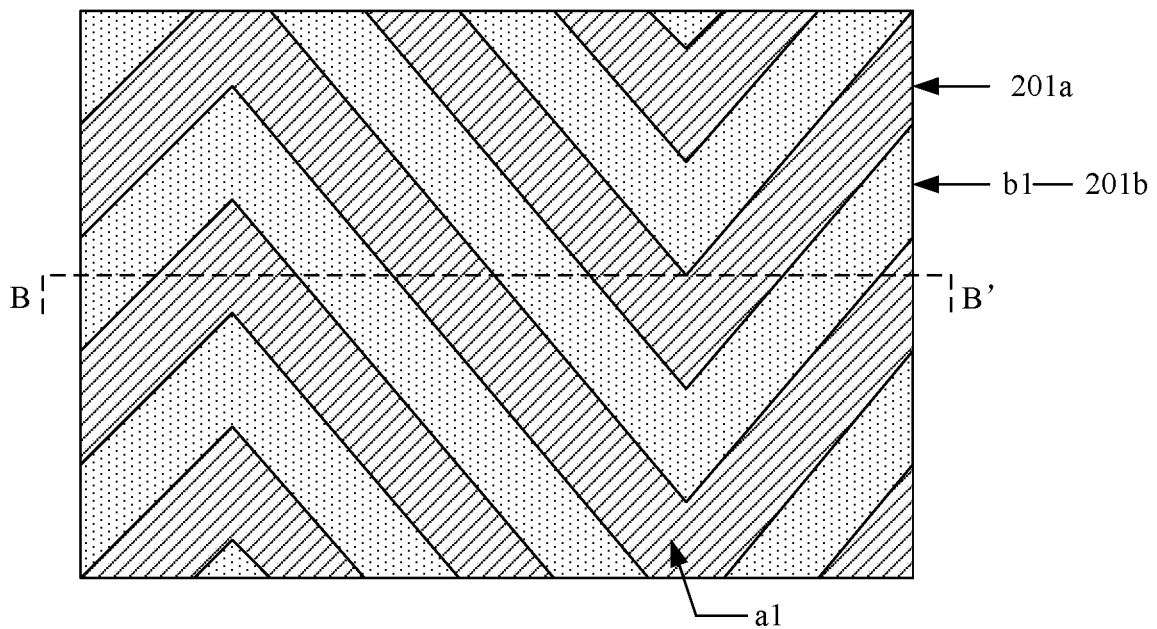
FIG. 4 is a schematic top view of a packaging structure according to an embodiment of the present disclosure.

Optionally, FIG. 4 is a schematic top view of a packaging structure according to an embodiment of the present disclosure. The packaging structure shown in FIG. 3 is a schematic cross-sectional view of the packaging structure shown in FIG. 4 along the BB' direction. As shown in FIG. 4, the inorganic pattern 201a includes a plurality of curved structures a1 arranged at intervals. The organic pattern 201b includes a first organic sub-pattern b1. With reference to FIG. 3 and FIG. 4, the first organic sub-pattern b1 and the inorganic pattern 201a are located in a same layer and are complementary in position. In the embodiment of the present disclosure, the first organic sub-pattern and the inorganic pattern being located in a same layer means that spatial structures of the first organic sub-pattern and the inorganic pattern are located in the same layer, that is, they are located at the same spatial height. It is not necessary to limit that the first organic sub-pattern and the inorganic pattern are prepared from one layering process. The first organic sub-pattern and the inorganic pattern being complementary in position means that the first organic sub-pattern is located in the gaps between the plurality of curved structures of the inorganic pattern which are arranged at intervals. That is, the first organic sub-pattern is formed from the organic material located in the gaps between the plurality of curved structures. The first organic sub-pattern may completely fill the gaps between the plurality of curved structures of the inorganic pattern which are arranged at intervals, or may only partially fill the gaps between the plurality of curved structures of the inorganic pattern which are arranged at intervals.

Figure 5:
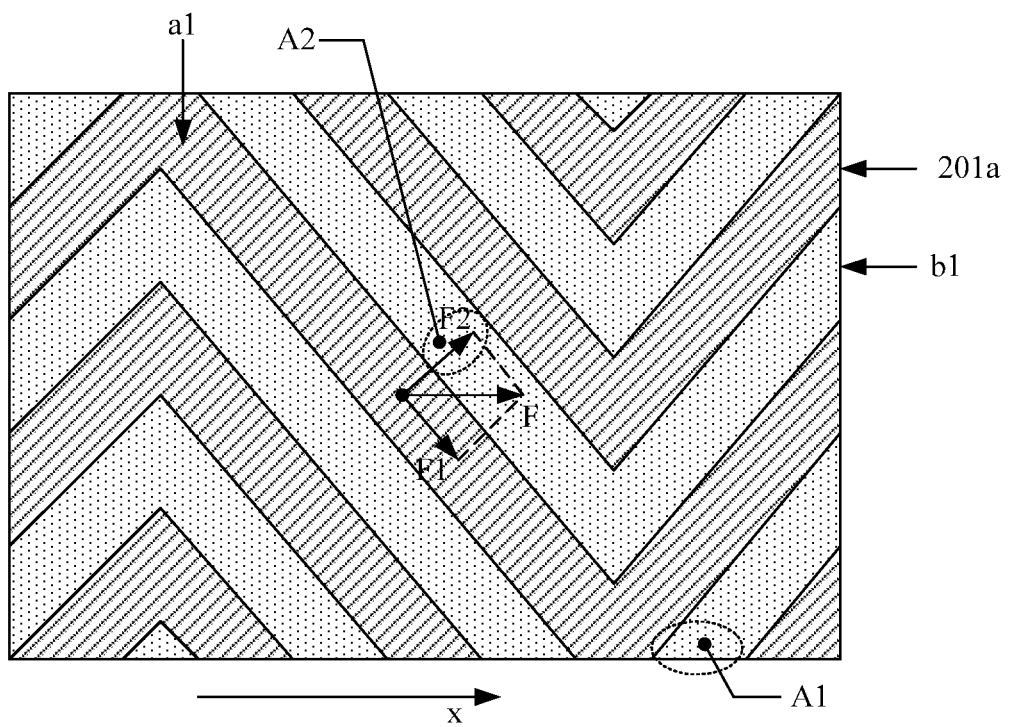
FIG. 5 is a schematic diagram of stress decomposition when the packaging structure as shown in FIG. 4 is bent in a first direction.

Exemplarily, FIG. 5 is a schematic diagram of stress decomposition when the packaging structure as shown in FIG. 4 is bent in a first direction. As shown in FIG. 5, when the packaging structure is bent in the first direction x, the interior of the inorganic pattern 201a is subjected to a stress F in the first direction x. The stress F may be decomposed into a first force component F1 and a second force component F2. The first force component F1 may extend to the end of the curved structure a1 in a direction of the first force component F1, and may be released into the first organic sub-pattern b1 adjacent to the end (that is, the position A1). The second force component F2 may be released from the edge of the curved structure a1 into the first organic sub-pattern b1 adjacent to the curved structure a1 (that is, the position A2).

Figure 6:
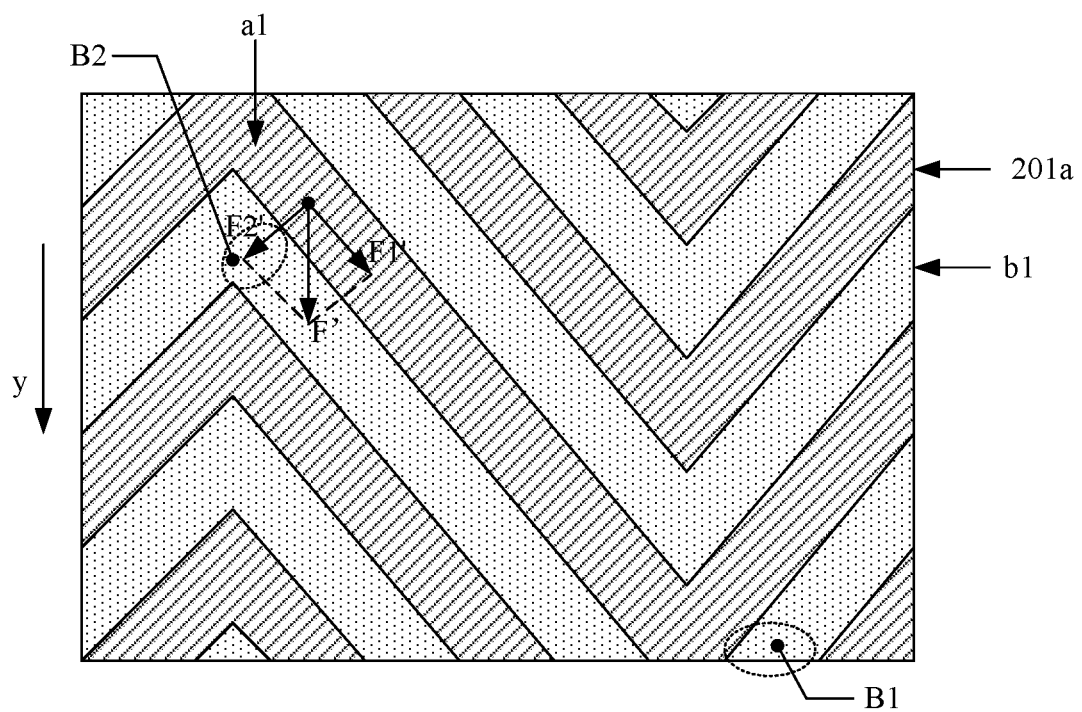
FIG. 6 is a schematic diagram of stress decomposition when the packaging structure as shown in FIG. 4 is bent in a second direction.

Further exemplarily, FIG. 6 is a schematic diagram of stress decomposition when the packaging structure as shown in FIG. 4 is bent in a second direction. As shown in FIG. 6, when the packaging structure is bent in the second direction y, the interior of the inorganic pattern 201a is subjected to a stress F' in the second direction y. The stress F' may be decomposed into a first force component F1' and a second force component F2'. The first force component F1' may extend to the end of the curved structure a1 in a direction of the first force component F1', and may be released into the first organic sub-pattern b1 adjacent to the end (that is, the position B1). The second force component F2' may be released from the edge of the curved structure a1 into the first organic sub-pattern b1 adjacent to the curved structure a1 (that is, the position B2).

Figure 7:
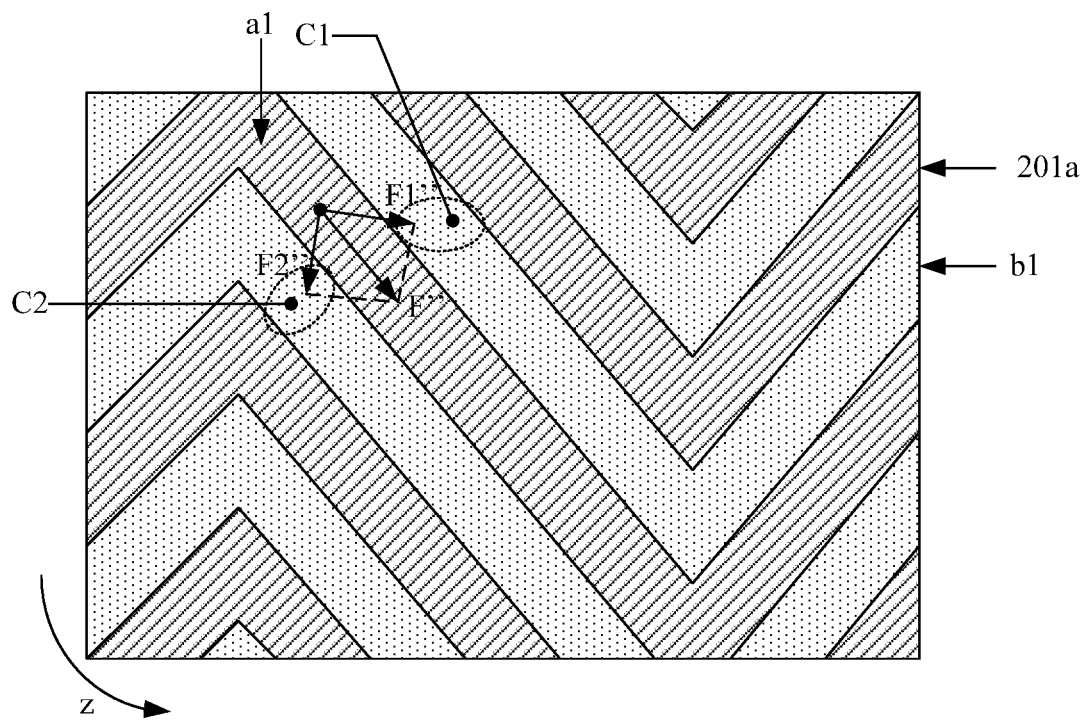
FIG. 7 is a schematic diagram of stress decomposition when the packaging structure as shown in FIG. 4 is bent in a third direction.

Yet exemplarily, FIG. 7 is a schematic diagram of stress decomposition when the packaging structure as shown in FIG. 4 is bent in a third direction. As shown in FIG. 7, when the packaging structure is bent in the third direction z, the interior of the inorganic pattern 201a is subjected to a stress F'' in the third direction z. The stress F'' may be decomposed into a first force component F1'' and a second force component F2''. The first force component F1'' may be released from the edge of the curved structure a1 into the first organic sub-pattern b1 adjacent to the curved structure a1 (that is, the position C1). The second force component F2'' may be released from the edge of the curved structure a1 into the first organic sub-pattern b1 adjacent to the curved structure a1 (that is, the position C2).

It should be noted that, with reference to FIG. 5 to FIG. 7, when the interior of the inorganic pattern in the packaging structure according to the embodiment of the present disclosure is subjected to a bending stress from any direction, the bending stress can be released into the organic pattern at the edge. As the organic pattern has a relatively good elasticity and can withstand the stress on the packaging structure due to the bending, the packaging structure can be bent in any direction.

In summary, the packaging structure according to the embodiment of the present disclosure includes at least one composite film layer, and the inorganic pattern in the composite film layer includes a plurality of curved structures arranged at intervals. As the bending stress on the interior of the inorganic pattern from any direction can be released into the organic pattern at the edge, the packaging structure can be bent in any direction while the structural stability of the packaging structure is ensured.

Figure 8:
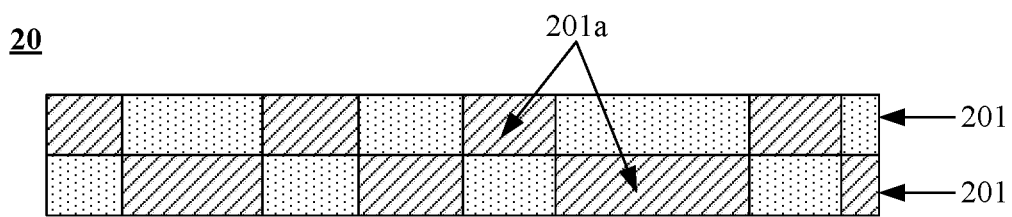
FIG. 8 is a schematic structural diagram of another packaging structure according to an embodiment of the present disclosure.

Optionally, FIG. 8 is a schematic structural diagram of another packaging structure according to an embodiment of the present disclosure. As shown in FIG. 8, the packaging structure 20 includes a plurality of composite film layers 201. The plurality of composite film layers 201 are arranged in layers along a direction away from the display device. Orthographic projection areas of the inorganic patterns 201a in the plurality of composite film layers 201 onto the display device cover the display area. The orthographic projection areas of the inorganic patterns in the plurality of composite film layers onto the display device refer to a union set of the orthographic projection areas of all the inorganic patterns in the plurality of composite film layers onto the display device.

It should be noted that by disposing the plurality of composite film layers in the packaging structure, the orthographic projection areas of the inorganic patterns in the plurality of composite film layers onto the display device can cover the display area, and thus the packaging effect of the packaging structure on the display device can be enhanced.

Optionally, with reference to FIG. 8, the above plurality of composite film layers includes a first composite film layer and a second composite film layer. The orthographic projection area of the inorganic patterns in the first composite film layer onto the display device and the orthographic projection area of the inorganic pattern in the second composite film layer onto the display device are complementary in position. That is, the inorganic pattern in the first composite film layer and the inorganic pattern in the second composite film layer are complementary in shape (the union set of the orthographic projection of the inorganic pattern in the first composite film layer onto the display device and the orthographic projection of the inorganic pattern in the second composite film layer onto the display device covers the display area of the display device), and there is no overlapping area between the orthographic projection area of the inorganic pattern in the first composite film layer onto the display device and the orthographic projection area of the inorganic pattern in the second composite film layer onto the display device. Alternatively, the union set of the orthographic projection of the inorganic pattern in the first composite film layer onto the display device and the orthographic projection of the inorganic pattern in the second composite film layer onto the display device covers the display area, and an overlapping area exists between the orthographic projection of the inorganic pattern in the first composite film layer onto the display device and the orthographic projection of the inorganic pattern in the second composite film layer onto the display device. This is not limited by the embodiment of the present disclosure.

Optionally, the packaging structure may also include three, four or more composite film layers which are arranged in layers, and the embodiment of the present disclosure does not limit the layer number of the composite film layers in the packaging structure.

Figure 9:
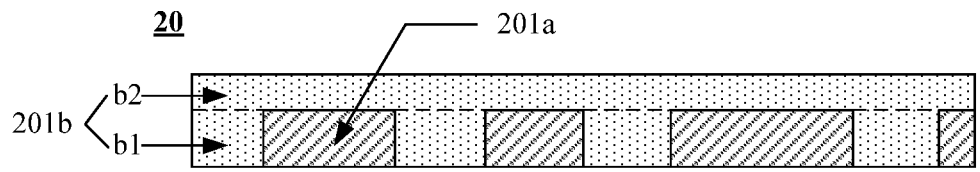
FIG. 9 is a schematic structural diagram of yet another packaging structure according to an embodiment of the present disclosure.

Optionally, FIG. 9 is a schematic structural diagram of yet another packaging structure according to an embodiment of the present disclosure. As shown in FIG. 9, the organic pattern 201*b* further includes a second organic sub-pattern b2. The second organic sub-pattern b2 is located on a side of the first organic sub-pattern b1 and the inorganic pattern 201*a* distal from the display device. In the embodiment of the present disclosure, the second organic sub-pattern may completely cover the side of the inorganic pattern and the first organic sub-pattern distal from the display device, and the second organic sub-pattern may be an entire layer structure. The second organic sub-pattern may also coat the side surface of the film layer where the inorganic pattern and the first organic sub-pattern are located, so as to protect the inorganic pattern.

Optionally, an orthographic projection of the second organic sub-pattern b2 onto the display device covers the display area of the display device. An edge of the orthographic projection area of the second organic sub-pattern onto the display device may be located in the non-display area of the display device, that is, the second organic sub-pattern may extend from the display area to the non-display area.

It should be noted that the second organic sub-pattern may play a role in buffering external forces to protect the display device.

In the embodiment of the present disclosure, the above plurality of curved structures includes at least one of a polyline-shaped structure and an arc-shaped structure. The polyline-shaped structure includes at least one of a zigzag structure, a W-shaped structure, a Z-shaped structure, and a V-shaped structure. The arc-shaped structure includes at least one of a wave-shaped structure, an S-shaped structure, and a U-shaped structure.

Exemplarily, with reference to FIG. 4, the curved structure al in the inorganic pattern 201*a* is a polyline-shaped structure, which includes a Z-shaped structure and a V-shaped structure.

It should be noted that FIG. 4 only shows a partial area of the packaging structure. The plurality of curved structures in the inorganic pattern may also include the zigzag structure and/or the W-shaped structure or other polyline-shaped structures. The shape of the polyline-shaped structure is related to the size of the display device to which the packaging structure belongs, which is not limited in the embodiment of the present disclosure.

Figure 10:
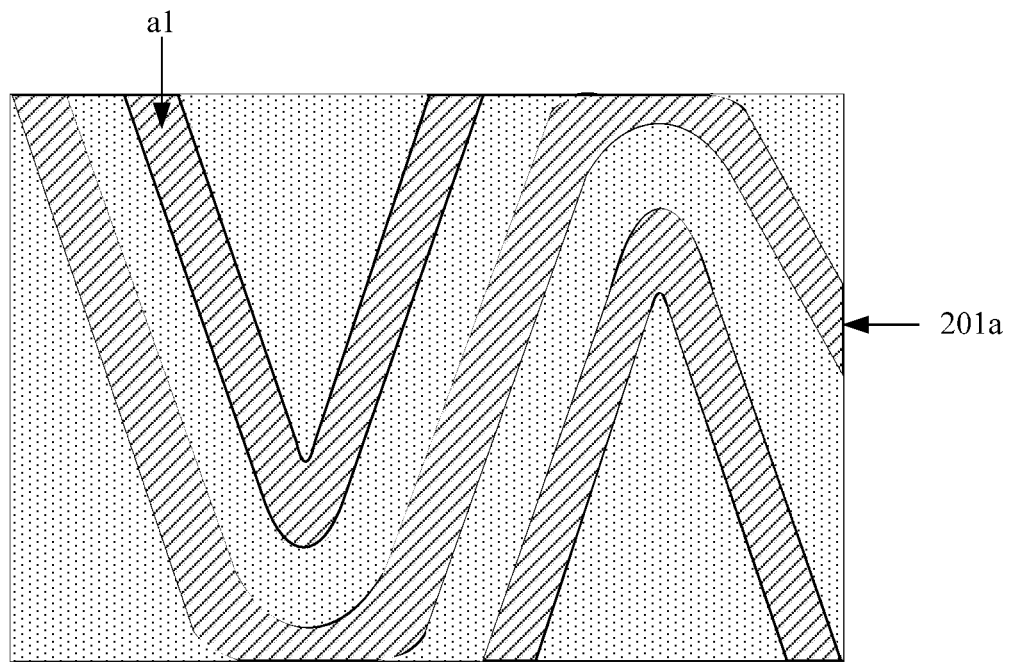
FIG. 10 is a schematic top view of another packaging structure according to an embodiment of the present disclosure.

Further exemplarily, FIG. 10 is a schematic top view of another packaging structure according to an embodiment of the present disclosure. As shown in FIG. 10, the curved structure al in the inorganic pattern 201*a* is an arc-shaped structure, which includes an S-shaped structure and a U-shaped structure. For the stress decomposition of the packaging structure shown in FIG. 10 upon being bent in various directions, a reference can be made to FIG. 5 to FIG. 7, and the details are not repeated in the embodiment of the present disclosure.

It should be noted that FIG. 10 only shows a partial area of the packaging structure. The plurality of curved structures in the inorganic pattern may also include other arc-shaped structures such as a wave-shaped structure. The shape of the arc-shaped structure is related to the size of the display device to which the packaging structure belongs, which is not limited in the embodiment of the present disclosure.

In the embodiment of the present disclosure, the shapes and profiles of the plurality of curved structures in the inorganic pattern may be substantially the same. For example, with reference to FIG. 4, all the curved structures al in the inorganic pattern 201*a* are polyline-shaped structures, including the Z-shaped structures and V-shaped structures. In another example, with reference to FIG. 10, all the curved structures al in the inorganic pattern 201*a* are arc-shaped structures, including the S-shaped structures and U-shaped structures. Optionally, the plurality of curved structures in the inorganic pattern may be disposed at equal intervals. When the packaging structure is bent, the curved structures disposed at equal intervals may uniformly release the internal bending stress to the adjacent organic pattern, thereby improving the reliability of the packaging structure.

In the embodiment of the present disclosure, the curved structure may be a structure of equal width, that is, the width of respective parts of the curved structure is equal. Optionally, the width of the curved structure may be equal to the distance between two adjacent curved structures. The arrangement uniformity of the inorganic pattern and the organic pattern can be improved, thereby improving the structural stability of the packaging structure. Of course, the curved structure may otherwise have a gradually changed width, which is not limited in the embodiment of the present disclosure.

Optionally, the inorganic pattern may be prepared from a metal material, for example, metal such as aluminum or copper, etc. The organic pattern may be prepared from an organic resin material, for example, a polyimide (PI) material or a polyester material, etc. The embodiment of the present disclosure does not limit the preparation materials of the inorganic pattern and the organic pattern.

In summary, the packaging structure according to the embodiment of the present disclosure includes at least one composite film layer, and the inorganic pattern in the composite film layer includes a plurality of curved structures arranged at intervals. As the bending stress applied on the interior of the inorganic pattern from any direction can be released into the organic pattern at the edge, the packaging structure can be bent in any direction while the structural stability of the packaging structure is ensured.

An embodiment of the present disclosure provides a display substrate, which includes a display device and the packaging structure as shown in any one of FIG. 3 to FIG. 10.

Figure 11:
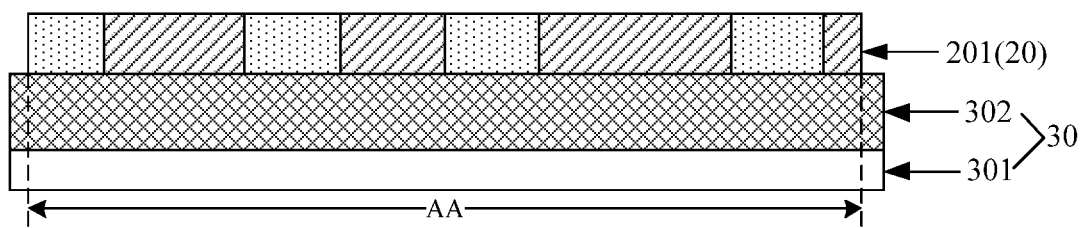
FIG. 11 is a schematic structural diagram of a display substrate according to an embodiment of the present disclosure.

Exemplarily, FIG. 11 is a schematic structural diagram of a display substrate according to an embodiment of the present disclosure. As shown in FIG. 11, the display substrate includes a packaging structure 20 as shown in FIG. 3. The display device 30 includes a base substrate 301 and a light-emitting device 302 located on the base substrate 301. The packaging structure 20 is located on a side of the light-emitting device 302 distal from the base substrate 301. An orthographic projection of the packaging structure 20 onto the display device 30 at least covers a display area of the display device 30. The packaging structure 20 includes at least one composite film layer 201. With reference to FIG. 11, an orthographic projection of the composite film layer 201 onto the display device 30 at least covers the display area AA of the display device 30.

Further exemplarily, FIG. 12 is a schematic structural diagram of another display substrate according to an embodiment of the present disclosure. As shown in FIG. 12, the display substrate includes the packaging structure 20 as shown in FIG. 8. With reference to FIG. 12, the plurality of composite film layers 201 in the packaging structure 20 includes a first composite film layer and a second composite film layer. The orthographic projection area aa of the inorganic pattern 201a in the first composite film layer onto the display device 30 and the orthographic projection area aa' of the inorganic pattern 201a in the second composite film layer onto the display device 30 are complementary in position. A union set of the orthographic projection area aa of the inorganic pattern 201a in the first composite film layer onto the display device 30 and the orthographic projection area aa' of the inorganic pattern 201a in the second composite film layer onto the display device 30 covers the display area AA of the display device.

Optionally, the display device is a flexible display device. For example, the display device may be an OLED display device or a quantum dot light-emitting diode (QLED) display device, etc., which is not limited in the embodiment of the present disclosure.

In summary, in the display substrate according to the embodiment of the present disclosure, the packaging structure in the display substrate includes at least one composite film layer, and the inorganic pattern in the composite film layer includes a plurality of curved structures arranged at intervals. As the bending stress on the interior of the inorganic pattern from any direction can be released into the organic pattern at the edge, the packaging structure can be bent in any direction while the structural stability of the packaging structure is ensured. In addition, the packaging structure can ensure the packaging reliability of the display device and realize the bending of the display substrate in any direction.

An embodiment of the present disclosure provides a display apparatus, which may include the display substrate as shown in FIG. 11 or FIG. 12.

Optionally, the display apparatus may be a flexible display apparatus. For example, the display apparatus may be an OLED display apparatus or a QLED display apparatus, etc. Specifically, the display apparatus may be electronic paper, a mobile phone, a tablet computer, a television, a monitor, a notebook computer, a digital photo frame, a navigator, etc.

In summary, in the display apparatus according to the embodiment of the present disclosure, the packaging structure in the display apparatus includes at least one composite film layer, and the inorganic pattern in the composite film layer includes a plurality of curved structures arranged at intervals. As the bending stress on the interior of the inorganic pattern from any direction can be released into the organic pattern at the edge, the packaging structure can be bent in any direction while the structural stability of the packaging structure is ensured. In addition, the packaging structure can ensure the packaging reliability of the display device, and realize the bending of the display apparatus in any direction. Therefore, the bending limitation of the display apparatus according to the embodiment of the present disclosure is reduced compared with the flexible display apparatus in the related art.

FIG. 13 is a flowchart diagram of a method for packaging a display device according to an embodiment of the present disclosure. As shown in FIG. 13, the method includes the following steps.

In step 401, a display device is provided, wherein the display device includes a base substrate and a light-emitting device on the base substrate.

Optionally, the light-emitting device may be a self-luminous device, for example, an OLED device or a QLED device, etc. The base substrate may be a flexible base substrate. For example, the base substrate may be prepared from a flexible PI material.

In step 402, at least one composite film layer is formed on a side of the light-emitting device distal from the base substrate, wherein the composite film layer includes an inorganic pattern and an organic pattern, the inorganic pattern includes a plurality of curved structures arranged at intervals, the organic pattern includes a first organic sub-pattern, and the first organic sub-pattern and the inorganic pattern are located in a same layer and are complementary in position.

The orthographic projection of the composite film layer onto the display device at least covers a display area of the display device.

Optionally, a plurality of composite film layers may be sequentially formed on the side of the light-emitting device distal from the base substrate. For example, the packaging structure as shown in FIG. 8 may be obtained.

In summary, in the method for packaging a display device according to the embodiment of the present disclosure, the packaging structure includes at least one composite film layer, and the inorganic pattern in the composite film layer includes a plurality of curved structures arranged at intervals. As the bending stress on the interior of the inorganic pattern from any direction can be released into the organic pattern at the edge, the packaging structure can be bent in any direction while the structural stability of the packaging structure is ensured. In addition, the packaging structure can ensure the packaging reliability of the display device.

Optionally, the implementation process of the above step 402 includes: forming the inorganic pattern on the side of the light-emitting device distal from the base substrate. The organic pattern is formed on the light-emitting device on which the inorganic pattern has been formed, to obtain one composite film layer. For example, a metal material is adopted to form the inorganic pattern on a side of the light-emitting device distal from the base substrate. An organic resin material is adopted to form the organic pattern on the light-emitting device on which the inorganic pattern has been formed.

In an optional embodiment of the present disclosure, the manner of forming the inorganic pattern on the side of the light-emitting device distal from the base substrate includes: forming the inorganic pattern on the side of the light-emitting device distal from the base substrate by using a first mask plate. The manner of forming the organic pattern on the light-emitting device on which the inorganic pattern has been formed includes: forming the first organic sub-pattern on the light-emitting device on which the inorganic pattern has been formed by using a second mask plate, and the first mask plate and the second mask plate are complementary in shape.

Optionally, the inorganic pattern may be prepared through an evaporation process or a patterning process by using the first mask plate. The organic pattern may be prepared through the evaporation process or patterning process by using the second mask plate. The patterning process includes: photoresist coating, exposure, development, etching and photoresist stripping.

Exemplarily, for the structure of the composite film layer formed by the above method, reference can be made to the composite film layer 201 in the packaging structure as shown in FIG. 3 or FIG. 8.

In another optional embodiment of the present disclosure, the manner of forming the inorganic pattern on the side of the light-emitting device distal from the base substrate includes: forming the inorganic pattern on the side of the light-emitting device distal from the base substrate by using the first mask plate. The manner of forming the organic pattern on the light-emitting device on which the inorganic pattern has been formed includes: forming the organic pattern on the light-emitting device on which the inorganic pattern has been formed by a coating process, and the organic pattern includes a first organic sub-pattern and a second organic sub-pattern which is arranged as an entire layer. The second organic sub-pattern is located on a side of the first organic sub-pattern and the inorganic pattern distal from the light-emitting device.

Optionally, the inorganic pattern may be prepared through an evaporation process or a patterning process by using the first mask plate.

Exemplarily, the structure of the composite film layer formed by the above method may refer to the composite film layer 201 in the packaging structure as shown in FIG. 9.

It should be noted that the sequence of the steps of the method for packaging a display device according to the embodiment of the present disclosure can be adjusted appropriately, and the steps can also be correspondingly increased or decreased according to the situation. The modified methods that can be easily conceived by anyone skilled in the art in the technical scope disclosed in the present disclosure should be covered by the scope of protection of the present disclosure, and therefore will not be repeated.

In summary, in the method for packaging a display device according to the embodiment of the present disclosure, at least one composite film layer is adopted to package the display device, and the inorganic pattern in the composite film layer includes a plurality of curved structures arranged at intervals. As the bending stress on the interior of the inorganic pattern from any direction can be released into the organic pattern at the edge, the packaging structure can be bent in any direction while the structural stability of the packaging structure is ensured. In addition, the packaging structure can ensure the packaging reliability of the display device, and realize the bending of the packaged display device in any direction. The bending limitation is reduced compared with the flexible display apparatus in the related art.

The structures involved in the above method embodiments have been described in detail in the related embodiments of the display apparatus, which will not be repeated in detail here.

It should be noted that in the accompanying drawings, for clarity of the illustration, the size of the layers and areas may be exaggerated. It may be understood that when an element or layer is described as being "on" another element or layer, the described element or layer may be directly on the other element or layer, or intermediate layers may be arranged between the described element or layer and the other element or layer. In addition, it may be understood that when an element or layer is described as being "under" another element or layer, the described element or layer may be directly below the other element or layer, or at least one intermediate layer may be arranged between the described element or layer and the other element or layer. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole description described above, like reference numerals denote like elements.

In the embodiments of the present disclosure, the terms "first" and "second" are used for descriptive purposes only and are not to be construed as indicating or implying relative importance. The term "a plurality of" refers to two or more, unless otherwise specifically defined.

The term "and/or" in the embodiments of the present disclosure only describes the correspondence of the corresponding objects, indicating three kinds of relationship. For example, A and/or B, may be expressed as: A exists alone, A and B exist concurrently, B exists alone. In addition, the character "/" generally indicates that the context object is an "OR" relationship.

The above embodiments are just the optional embodiments of the present disclosure, which will not limit the present disclosure. Any modifications, equivalent replacements and improvements made within the spirits and principles of the present disclosure shall all fall in the protection scope of the present disclosure.

What is claimed is:

1. A packaging structure for packaging a display device, the packaging structure comprising:
    at least one composite film layer, wherein the composite film layer comprises an inorganic pattern and an organic pattern, the inorganic pattern comprises a plurality of curved structures arranged at intervals, the organic pattern comprises a first organic sub-pattern, and the first organic sub-pattern and the inorganic pattern are located in a same layer and are complementary in position;
    wherein an orthographic projection of the composite film layer onto the display device at least covers a display area of the display device, the plurality of curved structures are disposed at equal intervals, and a width of the curved structure is equal to a distance between two adjacent curved structures.

2. The packaging structure according to claim 1, comprising a plurality of composite film layers, wherein the plurality of composite film layers are arranged in layers along a direction away from the display device; and
a union set of orthographic projection areas of the inorganic patterns in the plurality of composite film layers onto the display device covers the display area.

3. The packaging structure according to claim 2, wherein the plurality of composite film layers comprises a first composite film layer and a second composite film layer, and an orthographic projection area of an inorganic pattern in the first composite film layer onto the display device and an orthographic projection area of an inorganic pattern in the second composite film layer onto the display device are complementary in position.

4. The packaging structure according to claim 3, wherein the organic pattern further comprises a second organic sub-pattern located on a side of the first organic sub-pattern and the inorganic pattern distal from the display device, and an orthographic projection of the second organic sub-pattern onto the display device covers the display area.

5. The packaging structure according to claim 2, wherein the plurality of composite film layers comprises a first composite film layer and a second composite film layer, a union set of an orthographic projection of an inorganic pattern in the first composite film layer onto the display device and an orthographic projection of an inorganic pattern in the second composite film layer onto the display device covers the display area, and an overlapping area exists between the orthographic projection of the inorganic pattern in the first composite film layer onto the display device and the orthographic projection of the inorganic pattern in the second composite film layer onto the display device.

6. The packaging structure according to claim 1, wherein the plurality of curved structures comprises at least one of a polyline-shaped structure and an arc-shaped structure.

7. The packaging structure according to claim 6, wherein the polyline-shaped structure comprises at least one of a zigzag structure, a W-shaped structure, a Z-shaped structure and a V-shaped structure, and the arc-shaped structure comprises at least one of a wave-shaped structure, an S-shaped structure and a U-shaped structure.

8. The packaging structure according to claim 1, wherein the organic pattern further comprises a second organic sub-pattern, and the second organic sub-pattern is located on a side of the first organic sub-pattern and the inorganic pattern distal from the display device.

9. The packaging structure according to claim 8, wherein an orthographic projection of the second organic sub-pattern onto the display device covers the display area.

10. A display substrate, comprising: a display device and a packaging structure; wherein
the packaging structure comprises: at least one composite film layer, wherein the composite film layer comprises an inorganic pattern and an organic pattern, the inorganic pattern comprises a plurality of curved structures arranged at intervals, the organic pattern comprises a first organic sub-pattern, and the first organic sub-pattern and the inorganic pattern are located in a same layer and are complementary in position; and wherein an orthographic projection of the composite film layer onto the display device at least covers a display area of the display device, the plurality of curved structures are disposed at equal intervals, and a width of the curved structure is equal to a distance between two adjacent curved structures;
the display device comprises a base substrate and a light-emitting device on the base substrate, the packaging structure is located on a side of the light-emitting device distal from the base substrate, and an orthographic projection of the packaging structure onto the display device at least covers a display area of the display device.

11. The display substrate according to claim 10, wherein the display device is a flexible display device.

12. The display substrate according to claim 11, wherein the display device is an organic light-emitting diode display device or a quantum dot light-emitting diode display device.

13. A display apparatus comprising: the display substrate according to claim 10.

14. A method for packaging a display device, the method comprising:
providing a display device, wherein the display device comprises a base substrate and a light-emitting device on the base substrate;
forming at least one composite film layer on a side of the light-emitting device distal from the base substrate, wherein the composite film layer comprises an inorganic pattern and an organic pattern, the inorganic pattern comprises a plurality of curved structures arranged at intervals, the organic pattern comprises a first organic sub-pattern, and the first organic sub-pattern and the inorganic pattern are located in a same layer and are complementary in position;
wherein an orthographic projection of the composite film layer onto the display device at least covers a display area of the display device, the plurality of curved structures are disposed at equal intervals, and a width of the curved structure is equal to a distance between two adjacent curved structures.

15. The method according to claim 14, wherein forming at least one composite film layer on the side of the light-emitting device distal from the base substrate comprises:
forming an inorganic pattern on the side of the light-emitting device distal from the base substrate; and
forming an organic pattern on the light-emitting device on which the inorganic pattern has been formed to obtain one composite film layer.

16. The method according to claim 15, wherein forming the inorganic pattern on the side of the light-emitting device distal from the base substrate comprises:
forming the inorganic pattern on the side of the light-emitting device distal from the base substrate by using a first mask plate, and
forming the organic pattern on the light-emitting device on which the inorganic pattern has been formed comprises:
forming the first organic sub-pattern on the light-emitting device on which the inorganic pattern has been formed by using a second mask plate, a hollow area of the first mask plate and a hollow area of the second mask plate are complementary in shape.

17. The method according to claim 15, wherein forming the inorganic pattern on the side of the light-emitting device distal from the base substrate comprises:
forming the inorganic pattern on the side of the light-emitting device distal from the base substrate by using a first mask plate, and forming the organic pattern on the light-emitting device on which the inorganic pattern has been formed comprises:

forming the organic pattern on the light-emitting device on which the inorganic pattern has been formed by a coating process, wherein the organic pattern comprises the first organic sub-pattern and a second organic sub-pattern which is arranged as an entire layer, and the second organic sub-pattern is located on a side of the first organic sub-pattern and the inorganic pattern distal from the light-emitting device.

18. The method according to claim 14, wherein forming at least one composite film layer on the side of the light-emitting device distal from the base substrate comprises:

sequentially forming a plurality of composite film layers on the side of the light-emitting device distal from the base substrate.

* * * * *